(12) United States Patent
Sato et al.

(10) Patent No.: US 10,737,365 B2
(45) Date of Patent: Aug. 11, 2020

(54) TURN TABLE TRANSPORT CARRIAGE

(71) Applicants: SHIN-ETSU HANDOTAI CO., LTD., Tokyo (JP); FUJIKOSHI MACHINERY CORP., Nagano-shi, Nagano (JP)

(72) Inventors: Michito Sato, Nishigo-mura (JP); Yosuke Kanai, Nagano (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 208 days.

(21) Appl. No.: 15/513,477

(22) PCT Filed: Oct. 2, 2015

(86) PCT No.: PCT/JP2015/005024
§ 371 (c)(1),
(2) Date: Mar. 22, 2017

(87) PCT Pub. No.: WO2016/063464
PCT Pub. Date: Apr. 28, 2016

(65) Prior Publication Data
US 2017/0304991 A1    Oct. 26, 2017

(30) Foreign Application Priority Data

Oct. 22, 2014  (JP) ................. 2014-215583

(51) Int. Cl.
*B24B 37/34* (2012.01)
*F16M 11/10* (2006.01)
(Continued)

(52) U.S. Cl.
CPC ............. *B24B 37/34* (2013.01); *F16M 11/10* (2013.01); *F16M 11/42* (2013.01);
(Continued)

(58) Field of Classification Search
CPC ......... B24B 37/34; B24B 37/04; F16M 11/10; F16M 11/42; H01L 21/67712;
(Continued)

(56) References Cited

U.S. PATENT DOCUMENTS 3,813,825 A    6/1974  Weber et al.
4,268,201 A *  5/1981  Cayton ................. B65G 69/00
                                                      220/1.5
(Continued)

FOREIGN PATENT DOCUMENTS

CN        2795133 Y    7/2006
CN      101970261 A    2/2011
(Continued)

OTHER PUBLICATIONS

Jul. 13, 2017 Office Action issued in Taiwanese Patent Application No. 104134406.
(Continued)

*Primary Examiner* — Tan Le
(74) *Attorney, Agent, or Firm* — Oliff PLC (57) ABSTRACT

A turn table transport carriage configured to carry a turn table removed from a polishing apparatus or turn table which is to be disposed to the polishing apparatus, turn table transport carriage including a turn table holding section configured to hold the turn table, support base which supports the turn table holding section from a lower side, elevating mechanism which moves up and down the turn table holding section, and inclination mechanism which inclines the turn table holding section holding the turn table, the turn table transport carriage being characterized by enabling carrying the turn table in a state where the turn table holding section holding the turn table is inclined by the inclination mechanism. Consequently, there is provided the turn table transport carriage which has a narrow width at the time of carrying the turn table and can reduce a width of a passage for carrying the turntable.

2 Claims, 5 Drawing Sheets

(51) Int. Cl.

| | |
|---|---|
| *F16M 11/42* | (2006.01) |
| *B24B 37/24* | (2012.01) |
| *B62B 3/02* | (2006.01) |
| *H01L 21/677* | (2006.01) |
| *H01L 21/687* | (2006.01) |
| *H01L 21/304* | (2006.01) |
| *A47B 3/10* | (2006.01) |
| *B24B 37/04* | (2012.01) |

(52) U.S. Cl.
CPC .. *H01L 21/67712* (2013.01); *H01L 21/67718* (2013.01); *H01L 21/67724* (2013.01); *H01L 21/6875* (2013.01); *H01L 21/68707* (2013.01); *A47B 3/10* (2013.01); *B24B 37/04* (2013.01); *H01L 21/304* (2013.01)

(58) Field of Classification Search
CPC ......... H01L 21/67718; H01L 21/67724; H01L 21/68707; H01L 21/6875; H01L 21/304
See application file for complete search history.

(56) References Cited

U.S. PATENT DOCUMENTS

| | | | | | |
|---|---|---|---|---|---|
| 4,558,648 | A | * | 12/1985 | Franklin | B66F 7/065 108/136 |
| 2006/0145045 | A1 | * | 7/2006 | Chisholm | B25H 1/04 248/439 |
| 2008/0257225 | A1 | * | 10/2008 | Chianale | A47B 3/10 108/11 |
| 2010/0213148 | A1 | * | 8/2010 | Chen | B25H 1/04 211/85.8 |
| 2012/0313351 | A1 | * | 12/2012 | Chen | B25H 1/04 280/652 |
| 2013/0078074 | A1 | * | 3/2013 | Millsap | A01D 85/005 414/789.3 |

FOREIGN PATENT DOCUMENTS

| | | |
|---|---|---|
| CN | 102161409 A | 8/2011 |
| CN | 102745458 A | 10/2012 |
| JP | 2000-141205 A | 5/2000 |
| JP | 2008-093811 A | 4/2008 |
| JP | 2009-184775 A | 8/2009 |
| JP | 2012-096893 A | 5/2012 |

OTHER PUBLICATIONS

Jun. 28, 2018 Office Action issued in Chinese Patent Application No. 201580057427.8.
Nov. 24, 2015 Search Report issued in International Patent Application No. PCT/JP2015/005024.
Feb. 22, 2019 Office Action issued in Chinese Application No. 201580057427.8.
Aug. 21, 2019 Office Action issued in Chinese Patent Application No. 201580057427.8.

* cited by examiner

TURN TABLE TRANSPORT CARRIAGE

TECHNICAL FIELD

The present invention relates to a turn table transport carriage configured to carry a turn table removed from a polishing apparatus which polishes a semiconductor wafer and others or a turn table which is to be disposed to the polishing apparatus.

BACKGROUND ART

Polishing of a semiconductor wafer (which will be also simply referred to as a wafer hereinafter) as typified by a silicon wafer is carried out by a method for polishing both sides of the wafel at the same time or a method for polishing a single side of the wafer.

Figure 7:
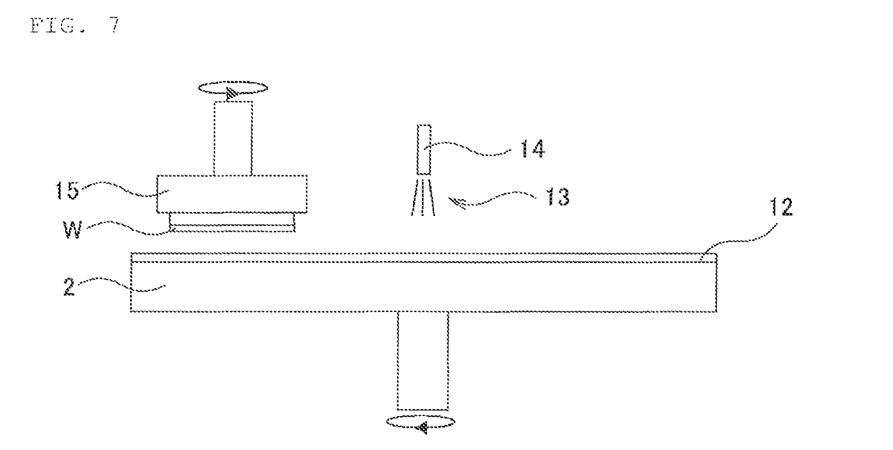
FIG. 7 is a schematic view showing an example of a general single-side polishing apparatus for wafers.

The polishing of a single side of a wafer is performed by using a polishing apparatus shown in FIG. 7 constituted of a turn table 2 having a polishing pad 12 attached thereto, a polishing agent supply mechanism 14 which supplies a polishing agent 13 onto the polishing pad 12, a polishing head 15 which holds a wafer W, and others. The wafer W is held by the polishing head 15, the polishing agent 13 is supplied onto the polishing pad 12 from the polishing agent supply mechanism 14, and the turn table 2 and the polishing head 15 are rotated respectively so that a surface of the wafer W is slid on the polishing pad 12, thereby polishing the wafer H (see, e.g., Patent Literature 1).

Further, the wafer W is often polished in multiple stages while changing a type of the polishing pad or a type of the polishing agent, and a polishing apparatus having two turn tables or three turn tables, which is called an index type, is often used.

Figure 8:
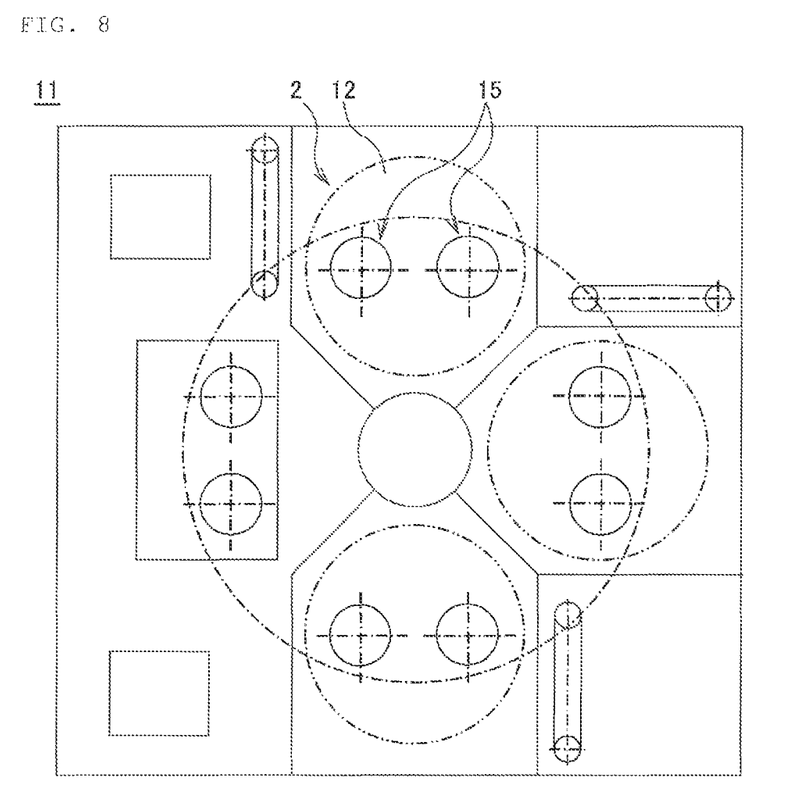
FIG. 8 is a schematic view showing an example of a general index type polishing apparatus for wafers.

Here, FIG. 8 shows an example of the index type polishing apparatus having three turn tables. Such an index type polishing apparatus 11 as shown in FIG. 8 has three turn tables 2, and two polishing heads 15 are assigned to each turn table. Thus, two wafers can be polished per batch, which is superior in productivity in particular.

A polishing pad used for polishing a wafer by such a polishing apparatus is subjected to a start-up operation called seasoning before use. Although a method of seasoning differs depending on a polishing pad to be used, brushing using a soft nylon brush or brushing using a ceramic or diamond dresser is generally performed. Further, Seasoning of actually polishing a wafer (a dummy wafer) which can serve as a polishing target is also performed.

The seasoning is often performed for a long time to stabilize quality of a surface of a new polishing pad immediately after replacement. In particular, the seasoning using the dummy wafer is performed for several hours depending on a type of the polishing pad in some solutions. Thus, in case of performing the seasoning in the polishing apparatus which actually carries out polishing, the polishing must be temporarily stopped during this process. Thus, productivity of wafers is greatly reduced.

Thus, to suppress a reduction in productivity of wafers caused by the seasoning, there is adopted a method of performing the seasoning alone with the use of another simple polishing apparatus (which will be referred to as an off-line set-up apparatus hereinafter) with a turn table to which a polishing pad is attached being detachable.

To perform the seasoning of a polishing pad with the use of the off-line set-up apparatus, a turn table having the polishing pad attached thereto is first disposed to the off-line set-up apparatus. Then, the seasoning of the polishing pad is carried out. When the seasoning of the polishing pad is completed, the turn table having the seasoned polishing pad attached thereto is removed from the off-line set-up apparatus. Subsequently, the turn table is disposed to the polishing apparatus which actually polishes wafers.

As the turn table, one made of stainless or ceramics is often used. In case of a turn table having a diameter of 800 mm and a thickness of 20 mm, a weight of the turn table made of stainless is approximately 80 kg, and a weight of the turn table made of ceramics is approximately 40 kg. As described above, the turn table made of stainless has the weight larger than that of the turn table made of ceramics. Furthermore, in case of the turn table made of stainless, the turn table s deformed by heat, and polishing quality is thereby affected in some cases. Thus, it is preferable to use the turn table made of ceramics.

Figure 9:
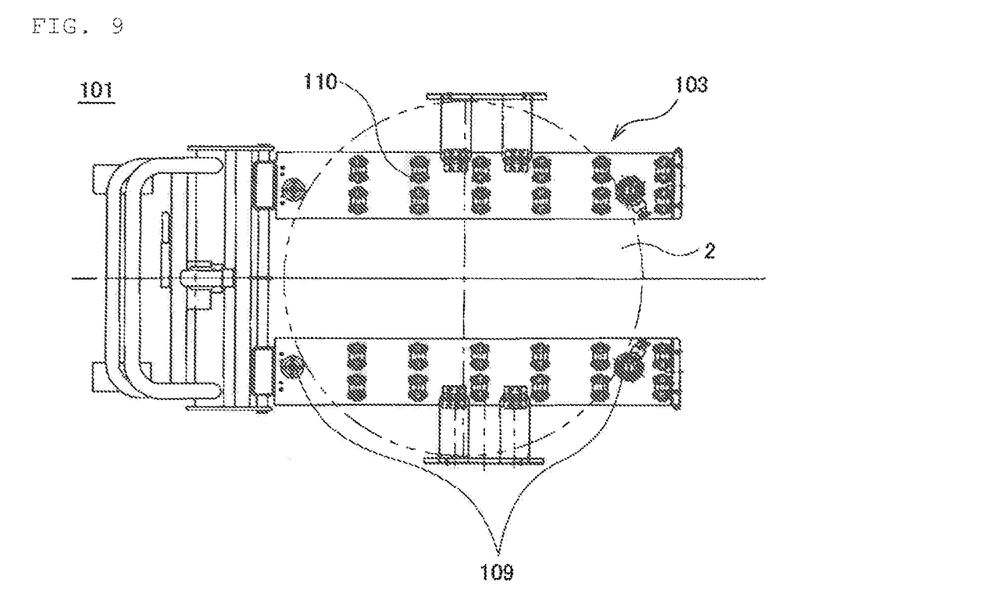
FIG. 9 is a schematic top view showing an example of a conventional turn table transport carriage.

In case of performing the seasoning of the polishing pad with the use of the off-line set-up apparatus, the turn table which is such a heavy load as described above mast be frequently attached and detached. To easily and safely attach or detach the turn table which is a heavy load described above, such a turn table transport carriage 101 which can carry such a turn table 2 as shown in FIG. 9 while holding it in a horizontal state is used. The turn table transport carriage 101 includes a turn table holding section 103 which holds the turn table 2 and an elevating mechanism which moves up and down the turn table holding section.

The turn table holding section 103 has turn table fall prevention mechanisms 109 which are configured to prevent the held turn table 2 from falling and hold and lock the turn table 2 in the horizontal state. Rollers 110 or free bearings are installed on a surface of the turn table holding section 103 which is in contact with the turn table 2 so that the turn table 2 which is a heavy load can be readily slid.

As the elevating mechanism, a hydraulic mechanism or a mechanism using a chain or a ball screw is adopted.

Here, a general procedure of removing the turn table 2 from the polishing apparatus and moving it onto the turn table transport carriage 101 will now be described.

The turn table transport carriage 101 is arranged in front of the turn table 2, which is installed in the polishing apparatus, to be removed.

A door of the polishing apparatus is opened, and a height of the turn table holding section 103 of the turn table transport carriage 101 is adjusted to a position which is equal to or slightly lower than a height of the turn table 2. At this time, a distance between the turn table 2 and the turn table transport carriage 101 may be large depending on positions of the turn table 2 and the turn table transport carriage 101. In such a case, a guide plate is installed between the turn table 2 and the turn table transport carriage 101.

In general, the turn table 2 is fixed at a predetermined position in the polishing apparatus by a mechanical locking mechanism which prevents protrusion due to rotation at the time of e.g., polishing a wafer and vacuum suction. To remove the turn table 2 from the polishing apparatus, the mechanical locking mechanism first removed. Moreover, the vacuum suction is stopped. At this time, when the turn table 2 is lifted up by using a line of the vacuum suction to supply air, the turn table 2 can be easily moved. Additionally, the turn table 2 may be removed from the polishing apparatus while supplying water so that the turn table 2 can readily slide.

Since the rollers 110 or the free bearings are provided to the turn table holding section 103 of the turn table transport carriage 101, the turn table 2 can be safely slid. The turn table is slid to a predetermined position on the turn table holding section 103, and the turn table is held by the turn table holding section 103. Further, the turn table 2 is fixed by the turn table fall prevention mechanisms 109 and carried.

At the time of disposing to the polishing apparatus the turn table subjected to the seasoning of the polishing pad attached to the turn table by the off-line set-up apparatus, the turn table is slid into the polishing apparatus from the turn table transport carriage in the order opposite to that of removing the turn table from the polishing apparatus except that the turn table holding section of the turn table transport carriage is adjusted to the height equal to or slightly higher than the height of the turn table receiver in the polishing apparatus, thereby enabling disposing.

However, when the polishing apparatus increases in size, a diameter of the turn table to be used also increases, and hence a passage along which the turn table is carried by the turn table transport carriage must be also widened. Furthermore, a wider space is required for attachment and detachment of the turn table, and hence there is a problem that a space efficiency around the polishing apparatus becomes poorer.

In particular, in case of such an index type polishing apparatus as shown in FIG. 8, since the turn table is detached and attached from three directions, the space efficiency around the polishing apparatus is greatly lowered.

Thus, the space efficiency is improved by laying out the space for attachment and detachment of the turn table so that it is shared by polishing apparatuses adjacent to each other.

Figure 10:
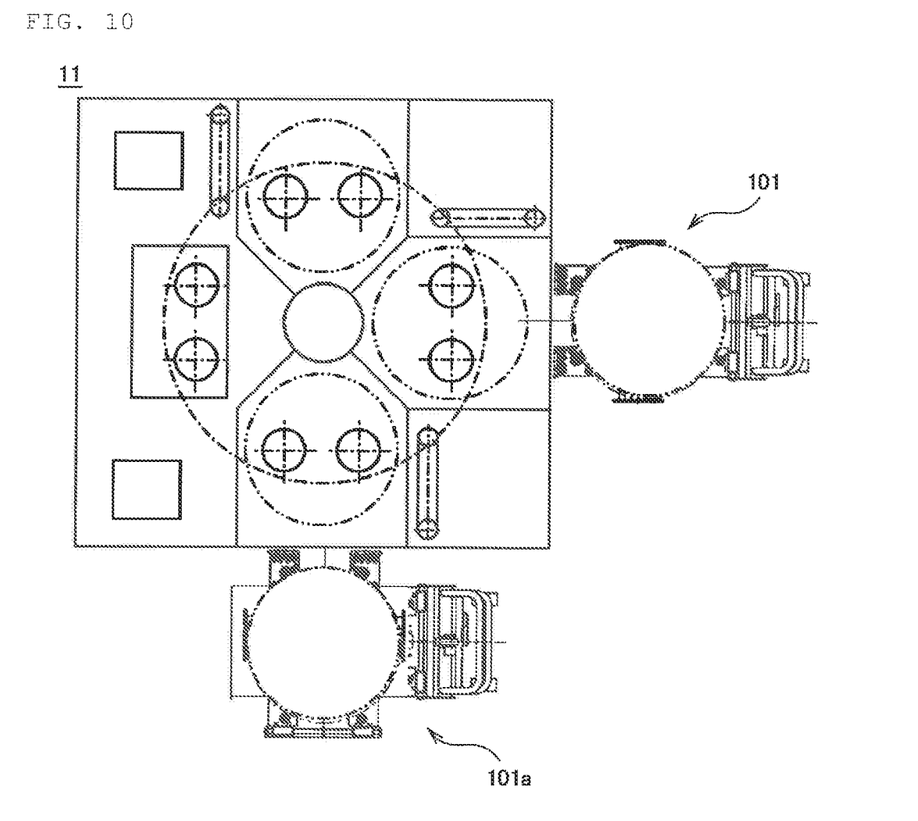
FIG. 10 is a schematic view showing how a turn table is disposed to a polishing apparatus by using the conventional turn table transport carriage.

Moreover, the turn table transport carriage 101 shown in FIG. 9 is a longitudinal attachment/detachment type by which the turn table 2 is accessed from the front side and the turn table 2 is attached or detached, but a turn table transport carriage which attaches or detaches the turn table from a side surface of the turn table transport carriage 101 is sometimes used. FIG. 10 shows how the turn table is disposed to the polishing apparatus 11 by the longitudinal attachment/detachment type turn table transport carriage 101 and a lateral attachment/detachment type turn table transport carriage 101a.

A power supply wiring line and water supply and drainage pipings (not shown) are provided around the polishing apparatus 11. Thus, as compared with the longitudinal attachment/detachment type turn table transport carriage 101, the lateral attachment/detachment type turn table transport carriage 101a is hard to access a side surface of the polishing apparatus 11 and has poorer workability. However, as shown in FIG. 10, in case of the lateral attachment/detachment type turn table transport carriage 101a, a space required for attaching or detaching the turn table to or from the polishing apparatus 11 can be reduced. Thus, a gap between the polishing apparatuses adjacent to each other can be narrowed, which is superior in the space efficiency.

However, even in case of such a lateral attachment/detachment type turn table transport carriage 101a as shown in FIG. 10, the turn table transport carriage 101a carries and attaches or detaches the turn table in the horizontal state. Thus, as the gap between the polishing apparatuses adjacent to each other, a space which is equal to or larger than a diameter of the turn table to be carried by the turn table transport carriage is required. Further, considering workability at the time of carrying the turn table by the turn table transport carriage or of attaching or detaching the turn table to or from the polishing apparatus, a space which is at least a diameter of the turn table plus 200 mm or more is required.

To uniform surface quality of a wafer when the wafer is polished by the polishing apparatus, it is desirable to perform the polishing in a state where the polishing pad is constantly in contact with the wafer. Thus, it is preferable for the diameter of the turn table to be larger than a diameter of the wafer which is a polishing target. Furthermore, to enhance productivity, the polishing apparatus 11 in which two polishing heads 15 are assigned to one turn table 2 as shown in FIG. 8 is often used.

In such a polishing apparatus, to simultaneously polish two wafers on one turn table, in case of polishing wafers each having a diameter of, e.g., 300 mm, a turn table having a turn table diameter of 800 mm is often used. As described above, since the space which is at least the diameter of the turn table plus approximately 200 mm is required, the gap for installing the polishing apparatuses adjacent to each other must be set to 1000 mm or more when the diameter of the turn table is 800 mm. As described above, in the polishing apparatus which polishes wafers each having a diameter of 300 mm or more, enhancing the space efficiency is difficult.

Meanwhile, as a large-diameter wafer whose wafer diameter exceeds 300 mm, a wafer having a diameter of 450 mm has been examined. As a turn table which can simultaneously polish two wafers each having a diameter of 450 mm, a turn table having a diameter of, e.g., 1200 mm can be used. A weight of the turn table having this size is approximately 90 kg when the turn table is made of ceramics. In case of the polishing apparatus in which a diameter of each turn table is 1200 mm, as a space for an attachment/detachment operation and carriage of each turn table using the conventional turn table transport carriage, 1400 mm or more is required.

As described above, in case of performing the attachment/detaching operation and the carriage of each turn table with the use of the conventional turn table transport carriage, these operations are always performed in a state where the turn table is horizontal, and hence the space efficiency is poor.

It is often the case where the polishing apparatus installed in a semiconductor factory is set in a clean room to suppress small scratches or defects caused by foreign particles, and the space efficiency at the time installing the polishing apparatus is affected by construction costs of the factory or running costs of utilities. Thus, an improvement in the space efficiency around the polishing apparatus has been demanded.

CITATION LIST

Patent Literature

Patent Literature 1: Japanese Unexamined Patent Publication (Kokai) No. 2008-93811

SUMMARY OF INVENTION

Technical Problem

In view of the problem, it is an object of the present invention to provide a turn table transport carriage which has a narrow width for, carrying a turn table and enables narrowing a width of a passage along which the turn table is carried.

Solution to Problem

To achieve the object, according to the present invention, there is provided a turn table transport carriage configured to carry a turn table removed from a polishing apparatus or the turn table which is to be disposed to the polishing apparatus, the turn table transport carriage including: a turn table holding section configured to hold the turn table; a support base which supports the turn table holding section from a lower side; an elevating mechanism which moves up and down the turn table holding section; and an inclination mechanism which inclines the turn table holding section holding the turn table, wherein the turn table transport carriage enables carrying the turn table in a state where the turn table holding section holding the turn table is inclined by the inclination mechanism.

With such an arrangement, a width of the turn table transport carriage at the time of carrying the turn table can be narrowed. Thus, a width of the passage along which the turn table is carried can be narrowed.

At this time, when the turn table transport carriage is seen from a side surface thereof, it is preferable for a length of the turn table holding section in a lateral direction to be longer than a length of the support base in the lateral direction, and the turn table holding section is eccentrically arranged to the support base.

With such an arrangement, at the time of changing the turn table holding section from an oblique state to a horizontal state to attach or detach the turn table, since the longer side of the eccentrically arranged turn table holding section can be arranged to be inserted into the polishing apparatus, a space required for attaching or detaching the turn table can be reduced. Consequently, a gap between the polishing apparatuses adjacent to each other can be further narrowed. Furthermore, when the turn table is horizontally set, a part of the turn table enters the polishing apparatus, and hence installation of a guide plate is no longer necessary, which is superior workability.

At this time, it is preferable that the inclination mechanism includes: at least one inclination plate which is disposed to an outer peripheral portion of the turn table holding section and accommodatable in the inner side; and at least one stopper arranged below the inclination plate, a portion of the turn table holding section on which the inclination plate is arranged does not move down when the stopper prevents the inclination plate from moving down at the time of lowering the turn table holding section, thereby inclining the turn table holding section.

Since the turn table holding section which holds the turn table can be inclined by such a simple configuration, costs can be out down.

Advantageous Effects of Invention

According to the turn table transport carriage of the present invention, since the width of the turn table transport carriage at the time of carrying the turn table can be narrowed, the width of the passage along which the turn table is carried can be narrowed.

DESCRIPTION OF EMBODIMENTS

As described above, at the time of carrying a turn table by a turn table transport carriage, when the turn table is carried in a horizontal state, a passage width for turn table carriage must be increased, and a problem of a poor space efficiency arises. Thus, to solve such a problem, the present inventors have repeatedly conducted keen examinations. Consequently, they have come to the conclusion that a width of a passage for carriage can be narrowed by carrying a turn table in a state where a turn table holding section holding the turn table is inclined. Moreover, they have carefully examined the best mode for carrying out these configurations, thereby bringing the present invention to completion. The turn table transport carriage according to the present invention will now be described hereinafter in detail with reference to the drawings.

Figure 1:
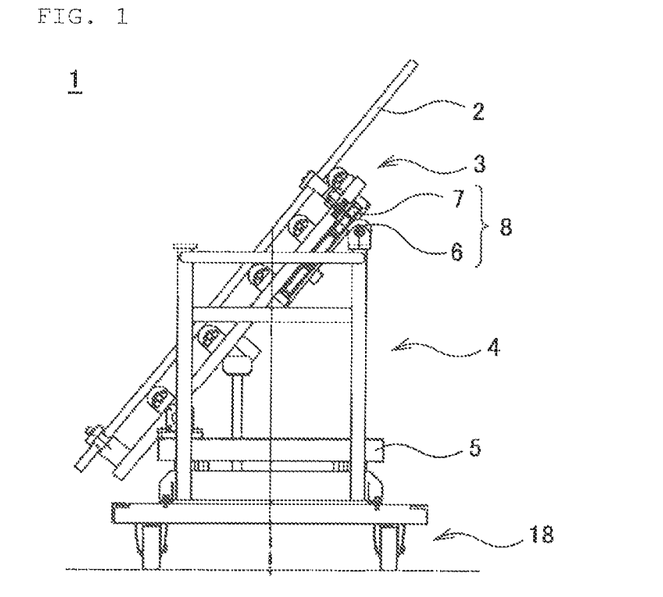
FIG. 1 is a schematic view showing an example of a turn table transport carriage according to the present invention.

The turn table transport carriage according to the present invention is configured to carry a turn table removed from a polishing apparatus or a turn table which is to be disposed to the polishing apparatus. As shown in FIG. 1, the turn table transport carriage 1 according to the present invention includes a turn table holding section 3 configured to hold a turn table 2, a support base 4 which supports the turn table holding section 3 from a lower side, an elevating mechanism 5 which moves up and down the turn table holding section 3, and an inclination mechanism 8 which inclines the turn table holding section 3 holding the turn table 2.

Figure 4:
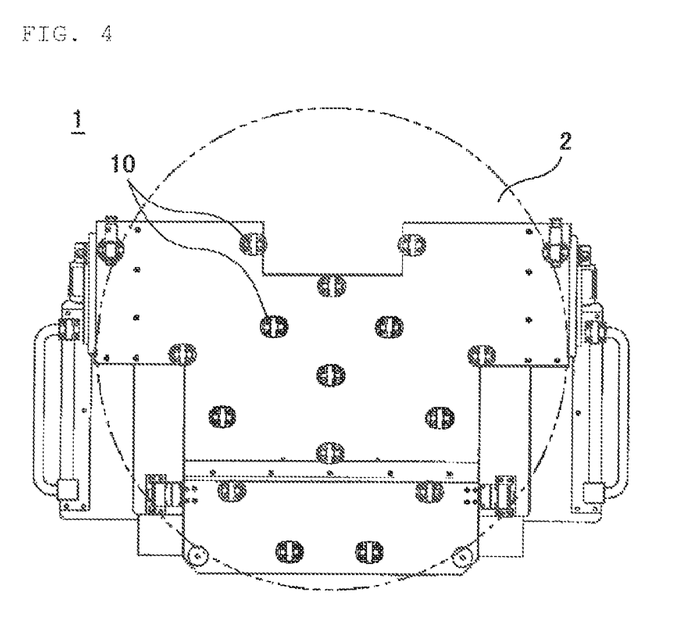
FIG. 4 is a schematic top view when the turn table is horizontally held on the turn table holding section in the turn table transport carriage according to the present invention.

A shape of the turn table holding section 3 is not restricted in particular and, for example, a shape which is a combination of rectangles may be adopted as shown in FIG. 4. It is preferable to set a lateral width of the turn table holding section to be shorter than a diameter of the turn table to be held, and adopting such a setting enables minimizing a width when the turn table holding section holding the turn table is inclined.

As shown in FIG. 4, it is preferable to arrange rollers 10 or free bearings on a surface of the turn table holding section 3 which is in contact with the the turn table 2. With such an arrangement, at the time of removing the turn table 2 from the polishing apparatus and moving it to the turn table holding section 3, or at the time of moving the turn table 2 from the turn table holding section 3 to the polishing apparatus to dispose the turn table 2 to the polishing apparatus, the turn table 2 can be easily slid, which is superior in operability.

Figure 5:
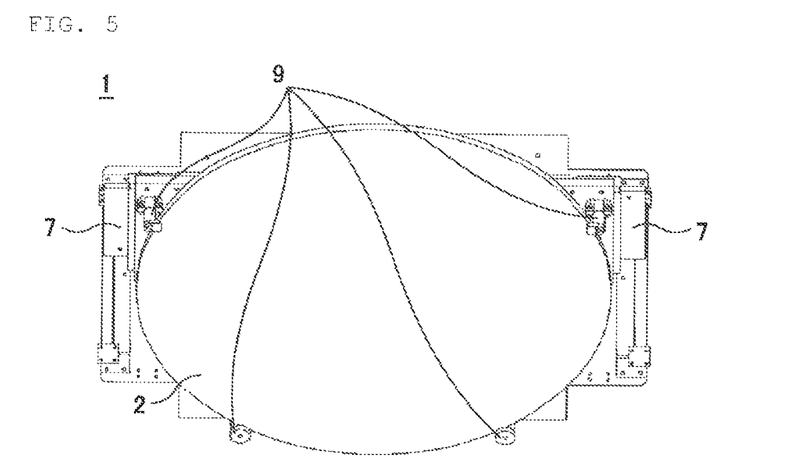
FIG. 5 is a schematic top view when the turn table is obliquely held on the turn table holding section in the turn table transport carriage according to the present invention.

As shown in FIG. 5, it is preferable to configure the turn table holding section 3 so that the turn table 2 does not fall when the turn table holding section 3 holding the turn table 2 is obliquely inclined and, for example, turn table fall prevention mechanisms 9 can be provided. The turn table fall prevention mechanisms fix the turn table so that the turn table is not detached from the turn table holding section in a state where the fail prevention mechanisms are locked, and the turn table can be freely detached from the holding section in an unlocked state. According to this configuration, even if the turn table holding section 3 holding the turn table 2 is inclined, the turn table can be safely carried.

Figure 3:
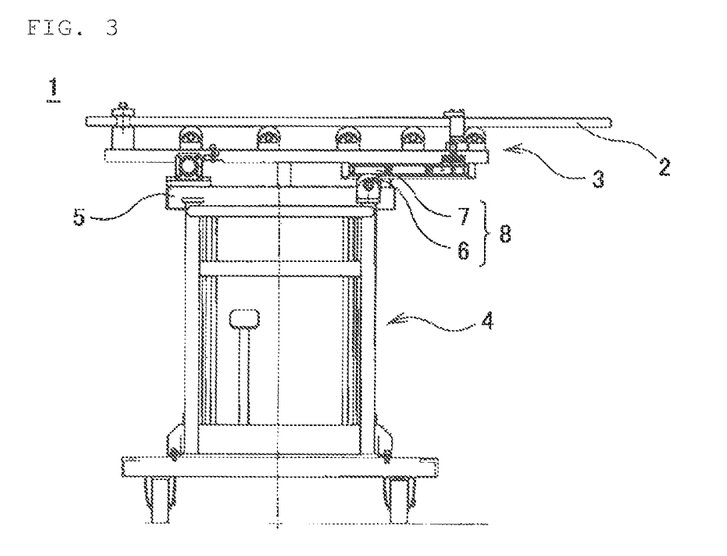
FIG. 3 is a schematic view showing a state where the turn table is horizontally held on the turn table holding section in the turn table transport carriage according to the present invention.

At this time, as shown in FIG. 3, it is preferable to eccentrically arrange the turn table holding section 3 to the support base 4 so that a length of the turn table holding section 3 in a lateral direction is longer than a length of the support base 4 in the lateral direction when the turn table transport carriage 1 is seen from a side surface. When the turn table 2 is held by such a turn table holding section 3, the held turn table is also eccentric to the support base 4. Thus, the turn table 2 is eccentrically arranged to the support base 4 of the turn table holding section 3, and the turn table 2 greatly protrudes from the support base 4 on a lengthened side.

Figure 6:
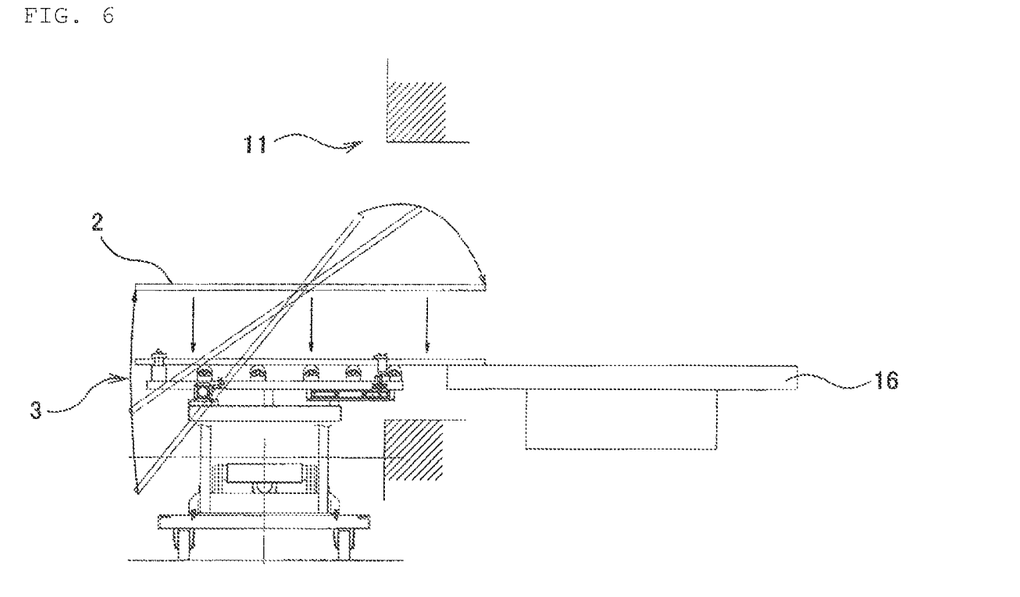
FIG. 6 is a schematic view showing how the turn table is disposed to a polishing apparatus by using the turn table transport carriage according to the present invention.

With such a configuration, as shown in FIG. 6, at the time of changing the turn table holding section 3 holding the turn table 2 from the inclined state to the horizontal state to attach or detach the turn table 2, since the lengthened side of the eccentrically arranged turn table holding section 3 can be inserted into the polishing apparatus 11, a space required at the time of attaching or detaching the turn table 2 can be reduced. Consequently, a gap between the polishing apparatuses adjacent to each other can be narrowed. Additionally, since a part of the turn table 2 enters the polishing apparatus 11 when the turn table 2 is horizontally set, a guide plate does not have to be installed. Further, adjusting a position of a stopper 6 so that a height of the turn table 2 when it is horizontally set becomes slightly higher than a turn table receiver 16 enables preventing the turn table 2 and the turn table receiver 16 from coming into contact with each other, thus providing excellent workability.

Figure 2:
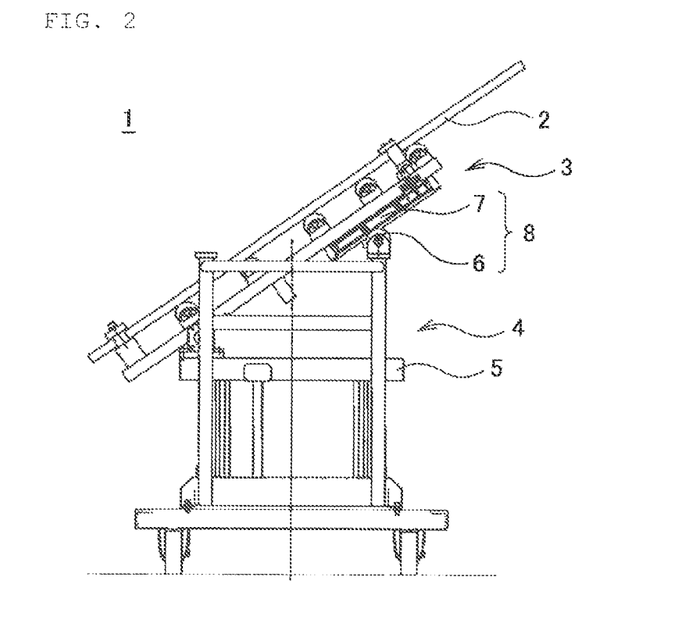
FIG. 2 is a schematic view showing an intermediate state between a state where a turn table is obliquely held on a turn table holding section and a state where the turn table is horizontally held on the same in the turn table transport carriage according to the present invention.

As shown in FIG. 1, FIG. 2, and FIG. 3, the support base 4 supports the turn table holding section 3 from a lower side.

It is preferable for the support base 4 to have a lateral width shorter than the length of the turn table holding section in the lateral direction. It is preferable for this lateral width to be shorter than the length in the lateral direction when the turn table 2 held by the turn table holding section is inclined. With this arrangement, the width when the turn table holding section 3 holding the turn table 2 is inclined can be minimized.

A plurality of wheels 18 can be arranged under the support base 4 so that the turn table transport carriage 1 can freely move. A wheel lock is arranged on each wheel 18 so that the turn table transport carriage can be prevented from spontaneously moving at the time of disposing or removing the turn table.

As shown in FIG. 1, it is preferable for a height of the support base 4 to be a height which can prevent the turn table holding section and the turn table from coming into contact with ground when the turn table holding section 3 holding the turn table 2 is inclined.

As the elevating mechanism 5, one arranged below the turn table holding section 3 can be used. The elevating mechanism 5 which can move up or down the turn table holding section 3 to an arbitrary height is preferable and, for example, a configuration based on a hydraulic system or a mechanism using chains, ball screws, or the like can be used.

The turn table holding section 3 can be manually moved up and down by the elevating mechanism 5. With this configuration, it is not necessary to mount any other device for elevation, and hence costs can be reduced.

A battery apparatus configured to move up and down the turn table holding section 3 with the use of the elevating mechanism 5 based on battery driving can be mounted in the turn table transport carriage 1. When the elevating mechanism 5 is driven by the battery, the turn table holding section 3 can be easily moved up and down, which is preferable.

An inclination mechanism 8 can be constituted of at least one inclination plate 7 which is disposed to an outer peripheral portion of the turn table holding section 3 and can be accommodated in an inner side and at least one stopper 6 which is arranged below the inclination plate 7. For example, as the stopper 6, a stopper with a roller can be used.

When the turn table holding section 3 (FIG. 3) holding the turn table 2 in the horizontal state is moved down by the elevating mechanism 5, the stopper 6 comes into contact with a back side of the inclination plate 7 to prevent downward movement (FIG. 2). Consequently, a portion of the turn table holding section 3 on which the inclination plate 7 is arranged does not move down, and hence the turn table holding section 3 can be inclined (FIG. 1). Since the turn table holding section 3 holding the turn table 2 can be inclined by the inclination mechanism 8 in this manner, the width of the turn table transport carriage 1 can be narrowed as compared with a state where the turn table 2 is held in the horizontal state.

On the other hand, in a state where the inclination plate 7 is accommodated in the inner side of the turn table holding section 3, when the turn table holding section 3 holding the turn table 2 is moved down by the elevating mechanism 5, since the inclination plate 7 does not come into contact with the stopper 6, the turn table holding section 3 holding the turn table 2 can be moved down while keeping the horizontal state.

Since the turn table holding section 3 holding the turn table 2 can be inclined by this simple mechanism, costs can be cut down.

An operation of disposing the turn table 2 to the polishing apparatus 11 will now be described with reference to FIG. 6.

The turn table holding section 3 holding the turn table 2 is carried in an obliquely inclined state, and the turn table transport carriage 1 is stopped in front of the turn table receiver 16, to which the turn table 2 is disposed, and fixed by wheel locks or the like.

When the turn table holding section 3 holding the turn table 2 is operated to enter the horizontal state by using the inclination mechanism, the turn table 2 gradually becomes horizontal, and the turn table 2 enters the inside of the polishing apparatus 11.

The inclination plate is accommodated in the turn table holding section 3, the turn table 2 held by the turn table holding section 3 is moved down while maintaining the horizontal state, and the turn table 2 is adjusted so that it is placed at a position equal to or slightly higher than a position of the turn table receiver 16.

The fall prevention mechanisms for the turn table 2 in the turn table holding section 3 are unlocked, and the turn table 2 is slid from the turn table holding section 3 to the side of the polishing apparatus 11. Since the turn table holding section 3 has the rollers or the free bearings, the turn table 2 can be readily slid. Furthermore, when air is supplied by using a hole for vacuum suction in the turn table receiver 16, the turn table 2 can be floated, and hence the turn table 2 can be easily slid. At this time, water may be supplied to the turn table receiver 16 so that the turn table 2 as a heavy load can be easily slid.

EXAMPLES

Although the present invention will now be more specifically described hereinafter with reference to an example and a comparative example of the present invention, the present invention is not restricted thereto.

EXAMPLE

In a turn table transport carriage according to the present invention having an inclination mechanism, each turn table having a diameter of 800 mm or 1200 mm was held by a turn table holding section, and the turn table holding section holding the turn tables was inclined by the inclination mechanism. A width of the turn table transport carriage at this moment was measured. A carrying passage width was calculated by adding 200 mm to the measured width of the turn table transport carriage. Respective measurement results and calculation results are shown in Table 1 and Table 2. It is to be noted that Table 1 and Table 2 also show results of a later-described comparative example.

In a case where the turn table had the diameter of 800 mm, the width of the turn table transport carriage at the time of inclining the turn table holding section holding the turn table was 500 mm. The width of the carrying passage was calculated as 700 mm.

TABLE 1

|  | Turn table [mm] | Maximum width of transport carriage [mm] | Width of carrying passage [mm] |
| --- | --- | --- | --- |
| Example | 800 | 500 | 700 |
| Comparative example | 800 | 800 | 1000 |

As shown in Table 2, when the diameter of the turn table was 1200 mm, the width of the turn table transport carriage when the turn table holding section holding the turn table was inclined was 800 mm. The width of the carrying passage was calculated as 1000 mm.

TABLE 2

|  | Turn table [mm] | Maximum width of transport carriage [mm] | Width of carrying passage [mm] |
| --- | --- | --- | --- |
| Example | 1200 | 800 | 1000 |
| Comparative example | 1200 | 1200 | 1400 |

COMPARATIVE EXAMPLE

In a conventional turn table transport carriage having no inclination mechanism, each turn table having a diameter of 800 mm or 1200 mm like Example was mounted, a width of the turn table transport carriage and a width of a carrying passage at this moment were obtained, and results were shown in Table 1 and Table 2. The width of the carrying passage is a value obtained by adding 200 mm to the width of the turn table transport carriage like Example.

As shown in, Table 1, in a case where the turn table had the diameter of 800 mm, the width of the turn table transport carriage when the turn table was held by the turn table holding section was 800 mm. The width of the carrying passage was calculated as 1000 mm.

As shown in Table 2, in a case where the turn table had the diameter of 1200 mm, the width of the turn table transport carriage when the turn table was held by the turn table holding section was 1200 mm. The width of the carrying passage was calculated as 1400 mm.

As described above, in Example, since the turn table transport carriage according to the present invention having the inclination mechanism which can incline the turn table holding section holding the turn table was used, in case of the turn table of 800 mm, a space of 300 mm was reduced from the width of the carrying passage as compared with Comparative Example. Moreover, in case of the turn table of 1200 mm, a space of 400 mm was reduced from each of the width of the carrying passage and a gap between polishing apparatuses in example as compared with Comparative Example.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A turn table transport carriage configured to carry a turn table that has been removed from a polishing apparatus or that is to be disposed to the polishing apparatus, the turn table transport carriage comprising:
   a turn table holding section configured to hold the turn table;
   a support base which supports the turn table holding section from a lower side;
   an elevating mechanism that has a first end and a second end opposite the first end and that is configured to raise and lower the turn table holding section, the turn table holding section being pivotally mountable to the first end of the elevating mechanism; and
   an inclination mechanism configured to incline the turn table holding section holding the turn table, the inclination mechanism comprising:
   at least one inclination plate configured to be moved between (i) a first state at an outer peripheral portion of the turn table holding section and (ii) a second state inside of the turn table holding section in plan view; and
   at least one stopper that (i) is attached to one end of the support base that is closer to the second end of the elevating mechanism than to the first end of the elevating mechanism, (ii) is arranged below the inclination plate, and (iii) comprises a roller, wherein:
   (i) in the first state, the at least one inclination plate is located so that, when the elevating mechanism lowers the turn table holding section, the inclination plate contacts the stopper and slides along the roller of the stopper so as to incline the turn table holding section; and (ii) in the second state, the at least one inclination plate is located so that, when the elevating mechanism lowers the turn table holding section, the inclination plate does not contact the stopper so as to allow the turn table holding section to be lowered in a horizontal state, and the turn table transport carriage is configured to carry the turn table in a state where the turn table holding section holding the turn table is inclined by the inclination mechanism.

2. The turn table transport carriage according to claim 1, wherein, when the turn table transport carriage is seen from a side surface thereof, a length of the turn table holding section in a lateral direction is longer than a length of the support base in the lateral direction, and the turn table holding section is eccentrically arranged to the support base.

\* \* \* \* \*